United States Patent
Roeck

(10) Patent No.: US 9,113,271 B2
(45) Date of Patent: Aug. 18, 2015

(54) METHOD FOR EXTENDING A FREQUENCY RANGE OF AN INPUT SIGNAL OF A HEARING DEVICE AS WELL AS A HEARING DEVICE

(75) Inventor: Hans-Ueli Roeck, Hombrechtikon (CH)

(73) Assignee: PHONAK AG, Stafa (CH)

( * ) Notice: Subject to any disclaimer, the term of this patent is extended or adjusted under 35 U.S.C. 154(b) by 0 days.

(21) Appl. No.: 14/131,760

(22) PCT Filed: Jul. 14, 2011

(86) PCT No.: PCT/EP2011/062077
§ 371 (c)(1),
(2), (4) Date: Jan. 9, 2014

(87) PCT Pub. No.: WO2013/007312
PCT Pub. Date: Jan. 17, 2013

(65) Prior Publication Data
US 2014/0177887 A1 Jun. 26, 2014

(51) Int. Cl.
*H04R 25/00* (2006.01)
*H03M 3/00* (2006.01)

(52) U.S. Cl.
CPC ............ *H04R 25/353* (2013.01); *H03M 3/468* (2013.01); *H03M 3/472* (2013.01); *H04R 25/00* (2013.01); *H04R 25/505* (2013.01); *H04R 2225/43* (2013.01); *H04R 2460/03* (2013.01)

(58) Field of Classification Search
CPC .... H04R 25/00; H04R 25/50; H04R 2225/43; H04R 25/356; H04R 25/407; H04R 25/505; H04R 2460/03; H03M 3/468; H03M 3/472
USPC ........ 381/312, 316, 320, 98, 60, 74, 314, 321
See application file for complete search history.

(56) References Cited

U.S. PATENT DOCUMENTS 4,843,623 A * 6/1989 Lafon et al. .................... 381/316
5,771,299 A * 6/1998 Melanson ...................... 381/316

(Continued)

OTHER PUBLICATIONS

Seo, et. al., "A Simple Method for Reproducing High Frequency Components at Low-Bit Rate Audio Coding", AES 113th Convention, Oct. 5-8, 2002, Lost Angeles, California, USA, pp. 1-7.

(Continued)

*Primary Examiner* — Huyen D Le
(74) *Attorney, Agent, or Firm* — Pearne & Gordon LLP

(57) ABSTRACT

The present invention is directed to a method and a hearing device for extending a usable frequency range of an analog input signal (i) being processed by a hearing device, the method comprising the steps of converting the analog input signal (i) to a first output signal ($o_1$) and to an intermediate signal ($o_m$), the first output signal ($o_1$) having a final sampling rate and the intermediate signal ($o_m$) having an intermediate sampling rate that is greater than the final sampling rate, applying a band-pass filter unit (31) to the intermediate signal ($o_m$) in order to obtain a filtered intermediate signal ($o_{mf}$), a lower cut-off frequency of the band-pass filter unit (31) being above half the final sampling rate, an upper cut-off frequency of the band-pass filter unit (31) being below half the intermediate sampling rate, and shifting a spectrum of the filtered intermediate signal ($o_{mf}$) to a frequency range being below the final sampling rate to obtain an intermediate output signal ($o_{m2}$).

16 Claims, 3 Drawing Sheets

(56) References Cited

U.S. PATENT DOCUMENTS 6,173,062 B1 *   1/2001   Dibachi et al. ............... 381/312
6,236,731 B1 *   5/2001   Brennan et al. ............... 381/316
6,240,192 B1 *   5/2001   Brennan et al. ............... 381/314
8,000,487 B2 *   8/2011   Fitz et al. ..................... 381/316

OTHER PUBLICATIONS

International Search Report for PCT/EP2011/062077 dated Mar. 15, 2013.
Written Opinion for PCT/EP2011/062077 dated Mar. 15, 2013.

* cited by examiner

METHOD FOR EXTENDING A FREQUENCY RANGE OF AN INPUT SIGNAL OF A HEARING DEVICE AS WELL AS A HEARING DEVICE

TECHNICAL FIELD OF THE INVENTION

The present invention is related to a method for extending a usable frequency range of an analog input signal being processed by a digital hearing device as well as to a hearing device.

DESCRIPTION OF THE RELATED ART

Today's digital hearing devices are usually operated with a sampling rate between 16 and 20 kHz, which limits the audio bandwidth from 8 to 10 kHz (also known as Nyquist frequency) due to Shannon's sampling theorem. Hearing devices with a higher sampling rate are known but have proportionally higher energy consumption because the processing of algorithms in the hearing device run on a faster pace.

A digital hearing device comprises an analog-to-digital converter that converts an analog signal representing an acoustical signal into a digital signal. Very often, an analog-to-digital converter is used that is based on a $\Sigma$-$\Delta$principle, in which the analog signal is sampled at a very high frequency but with very coarse resolution, shifting the quantization noise to high frequencies outside the intended audio frequency range with help of a noise shaping modulator. By a subsequent sampling rate decimation and digital filtering of the quantization noise, a high quality audio signal having a rather high resolution is obtained.

The input frequency range usable for these methods is limited though by the maximum audio bandwidth as given by the analog-to-digital converter output sampling rate. As already pointed out, the output of these algorithms may not present a frequency spectrum having energy above a certain frequency, namely above half the sampling rate or Nyquist frequency.

As the analog signal representing the audio signal contains useful information above the Nyquist frequency, for example for a good localization and a good intelligibility of sharp consonants (as for example "s" vs. "sh" vs. "f"), it is a pity that with today's sampling method, the information above the Nyquist frequency is either lost and cannot be used anymore, or the sampling rate and thus the Nyquist frequency have to get increased with mentioned drawbacks.

SUMMARY OF THE INVENTION

It is therefore at least one object of the present invention to describe a method to extend the usable acoustical input bandwidth of a hearing device.

It is pointed out that the term "hearing device"—as it is used in connection with the present invention—must be understood as being a device to improve the hearing of a hearing impaired patient, be the device positioned behind the ear or in the ear canal, or be the device implanted. In addition, the term "hearing device" also comprises any communication device, be it wired or wireless, or any hearing protection device.

The present invention is first directed to a method for extending a frequency range of an analog input signal being processed by a hearing device. The inventive method comprises the steps of:
  converting the analog input signal to a first output signal and to an intermediate signal, the first output signal having a final sampling rate and the intermediate signal having an intermediate sampling rate that is greater than the final sampling rate,
  applying a band-pass filter unit to the intermediate signal in order to obtain a filtered intermediate signal, a lower cut-off frequency of the band-pass filter unit being above half the final sampling rate, an upper cut-off frequency of the band-pass filter unit being below half the intermediate sampling rate, and
  shifting a spectrum of the filtered intermediate signal to a frequency range being below the final sampling rate to obtain an intermediate output signal.

Therewith, additional information above the Nyquist frequency is made available for processing in the signal processing unit resulting in improved intelligibility for the hearing device user.

A further embodiment of the present invention comprises the step of decimating the intermediate sampling rate of the intermediate output signal to the final sampling rate to obtain a second output signal.

Therewith, the additional information may also be processed at the same pace as the base-band information between DC and half the final sampling rate. As a result, energy consumption can be substantially reduced compared to the energy consumption of a signal processing unit running at a higher pace.

Further embodiments of the present invention comprise the step of converting the analog input signal in at least two decimation stages (22, 23, 24).

In further embodiments of the present invention, the spectrum of the filtered intermediate signal is shifted to a frequency range lying below half the final sampling rate.

In still further embodiments of the present invention, the intermediate sampling rate is an even integer multiple higher than the final sampling rate.

In further embodiments of the present invention, the intermediate sampling rate is four times higher than the final sampling rate.

Further embodiments of the present invention comprise the step of processing the first output signal and the intermediate output signal in the hearing device.

Further embodiments of the present invention comprise the step of processing the first output signal and the second output signal in the hearing device.

In addition, the present invention is also directed to a hearing device comprising:
  an input transducer for generating an analog input signal,
  an analog-to-digital converter unit for converting the analog input signal to a first output signal and to an intermediate signal, the first output signal having a final sampling rate and the intermediate signal having an intermediate sampling rate that is greater than the final sampling rate,
  a band-pass filter unit for applying to the intermediate signal in order to obtain a filtered intermediate signal, a lower cut-off frequency of the band-pass filter unit being above half the final sampling rate, an upper cut-off frequency of the band-pass filter unit being below half the intermediate sampling rate, and
  means for shifting a spectrum of the filtered intermediate signal to a frequency range being below the final sampling rate to obtain an intermediate output signal.

A further embodiment of the inventive hearing device comprise a decimation unit for decimating the intermediate sampling rate of the intermediate signal to the final sampling rate to obtain a second output signal.

In still further embodiments of the inventive hearing device, the analog-to-digital converter comprises at least two decimation stages.

In further embodiments of the inventive hearing device, the spectrum of the filtered intermediate signal is shifted to a frequency range lying below half the final sampling rate.

In further embodiments of the inventive hearing device, the intermediate sampling rate is an even integer multiple higher than the final sampling rate.

In further embodiments of the inventive hearing device, the intermediate sampling rate is four times higher than the final sampling rate.

Further embodiments of the inventive hearing device further comprise a signal processing unit for processing the first output signal and the intermediate output signal.

Further embodiments of the inventive hearing device further comprise a signal processing unit for processing the first output signal and the second output signal.

It is pointed out that the above-mentioned embodiments can be combined in any combination. Only those combinations are excluded that would otherwise result in a contradiction.

BRIEF DESCRIPTION OF THE DRAWINGS

The present invention is further described by referring to drawings showing exemplified embodiments of the present invention.

DETAILED DESCRIPTION OF THE INVENTION

Figure 1:
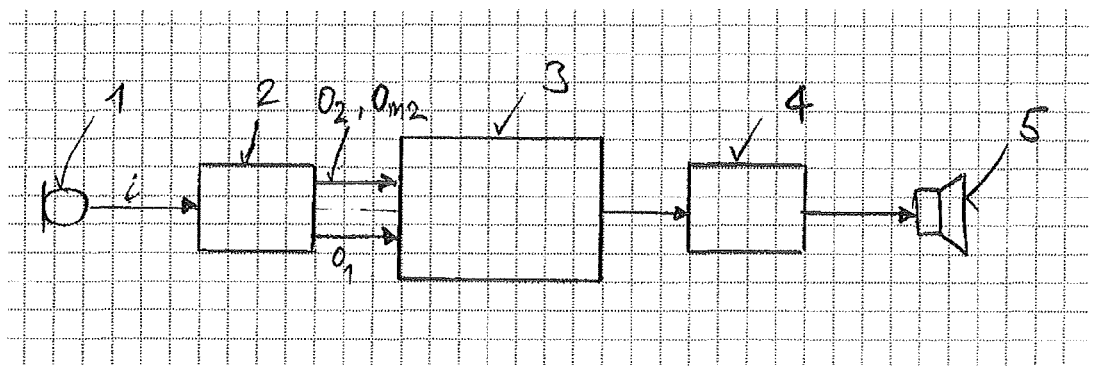
FIG. 1 shows a block diagram of a hearing device according to the present invention with its main components.

FIG. 1 shows a block diagram of a hearing device according to the present invention comprising an input transducer 1, e.g. a microphone, an analog-to-digital converter 2, a signal processing unit 3, a digital-to-analog converter 4 and an output transducer 5, e.g. a loudspeaker that is often also called receiver. The output transducer 5 can also be, for example, any kind of implantable actuator for actuating the nervous system of a patient.

Figure 3:
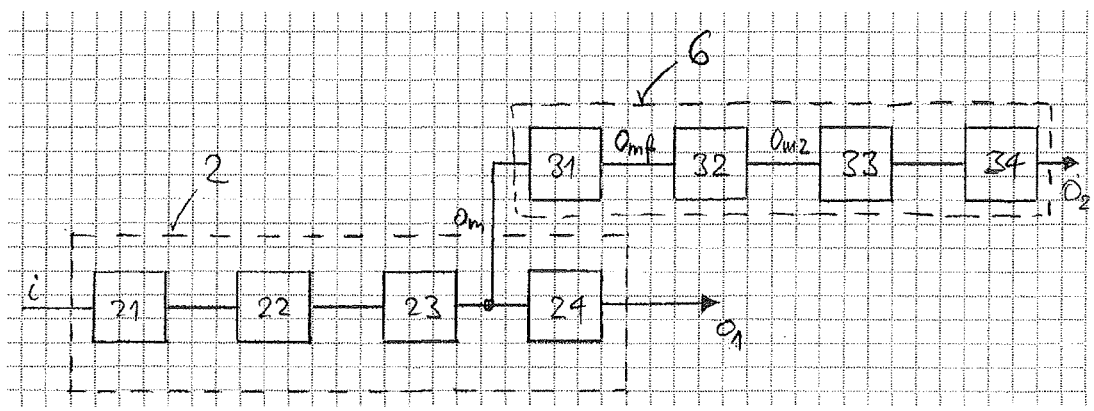
FIG. 3 shows a block diagram of a front end of a first embodiment of a hearing device according to the present invention.
Figure 4:
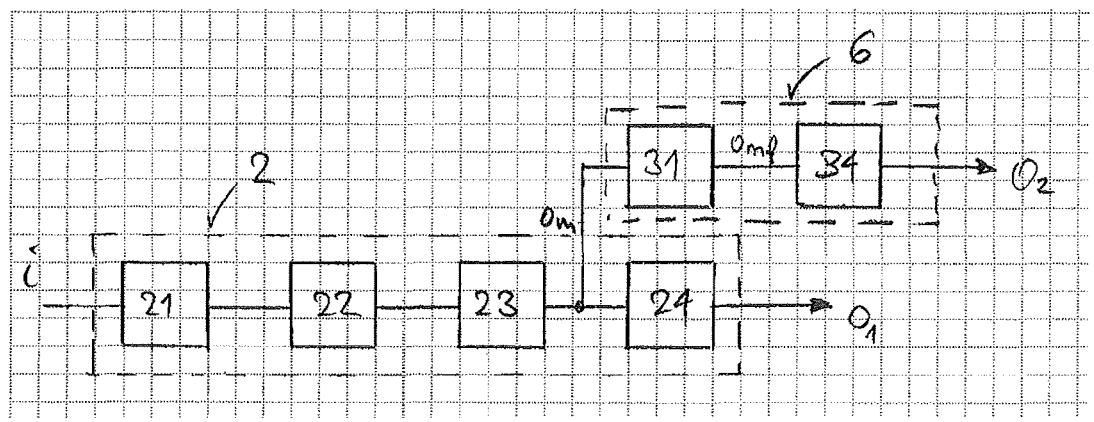
FIG. 4 shows a further block diagram of a front end of a second embodiment of a hearing device according to the present invention.

The input transducer 1 picks up an acoustic signal and generates an analog input signal i that is converted to a first output signal $o_1$ and to a second output signal $o_2$ (or to an intermediate output signal $o_{m2}$) by the analog-to-digital converter 2. The first output signal $o_1$ represents the sampled and digitized audio signal as it is also processed by known hearing devices, i.e. it represents the audio signal from DC (Direct Current) up to the Nyquist frequency, e.g. 8 to 10 kHz. The second output signal $o_2$ (or the intermediate output signal $o_{m2}$) comprises the extended frequency range according to the present invention, i.e. information above the Nyquist frequency of the first output signal $o_1$. FIGS. 3 and 4 show examples how to obtain the second output signal $o_2$.

Figure 5:
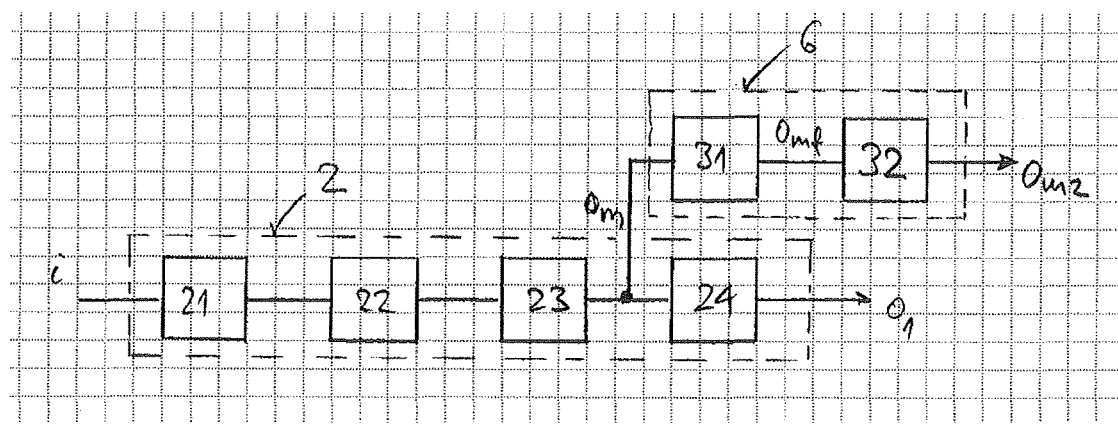
FIG. 5 shows a still further block diagram of a front end of a third embodiment of a hearing device according to the present invention.

The difference between the second output signal $o_2$ and the intermediate output signal $o_{m2}$ will be explained in connection with FIG. 5.

Figure 2:
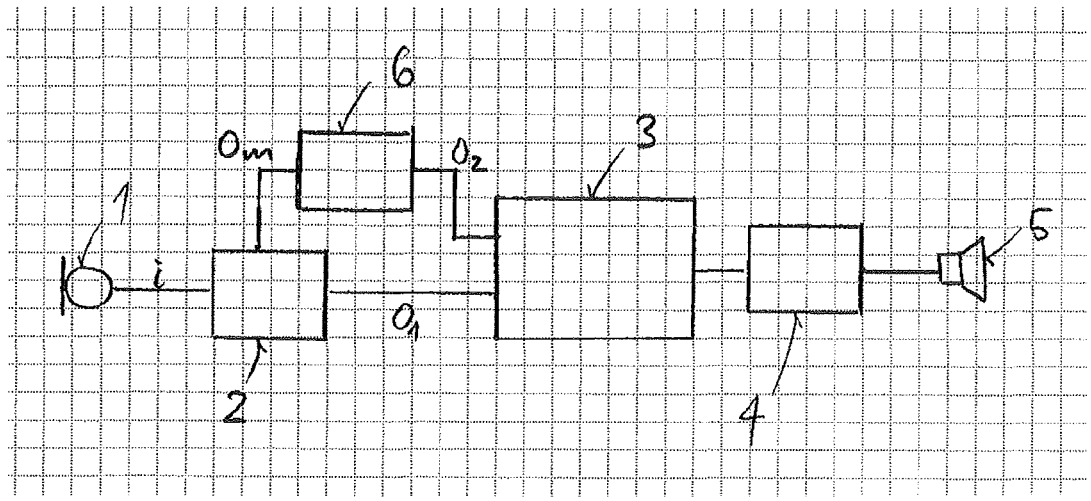
FIG. 2 shows a further block diagram of a hearing device according to further embodiment of the present invention.

While the first and the second output signal $o_1$ and $o_2$ (or the intermediate output signal $o_{m2}$) are generated in the analog-to-digital converter 2 according to the embodiment depicted FIG. 1, only a part of the analog-to-digital converter 2 is used to generate the second output signal $o_2$ according the embodiment depicted in FIG. 2. In fact, an intermediate output signal $o_m$, which is also generated by the analog-to-digital converter 2, is used that is further processed in an auxiliary converter unit 6. The auxiliary converter unit 6 generates the second output signal $o_2$ (or the intermediate output signal $o_{m2}$) from the intermediate output signal $o_m$. Again, FIGS. 3 and 4 show examples how to obtain the second output signal $o_2$ via the intermediate output signal $o_m$.

In a further embodiment of the present invention (not shown in the drawings), the first and the second output signals $o_1$ and $o_2$ are independently generated from the input signal i. For example, the first output signal $o_1$ is generated in the analog-to-digital converter 2 from the input signal i, and the second output signal $o_2$ is also directly generated in a converter unit from the input signal i. As a result, the first output signal $o_1$ and the second output signal $o_2$ are independently generated and fed to the signal processing unit 3.

In FIG. 3, only the front end of the hearing device is depicted, namely the analog-to-digital converter 2 and the auxiliary converter unit 6 (both in dashed-line boxes). In both FIGS. 3 and 4, the analog-to-digital converter 2 comprises a modulator unit 21 and several filter and decimation stages 22, 23 and 24. While the modulator unit 21 is oversampling the input signal i at a very high sampling rate, the first, second and third filter and decimation stages 22, 23 and 24 filter and decimate the sampling rate to a desired sampling rate that is the final sampling rate $f_s$ of the first output signal $o_1$. As has been described in the introductory part of this specification, the described analog-to-digital converter 2 generating the first output signal $o_1$ may be based on a so-called $\Sigma$-$\Delta$ principle that is widely known in the state of the art.

The present invention utilizes an intermediate signal $o_m$ of the analog-to-digital converter 2 already available, the intermediate signal $o_m$ having an intermediate sampling rate $f_m$ that is higher than the final sampling rate $f_s$. For example, the intermediate sampling rate $f_m$ is an integer multiple of the final sampling rate $f_s$, such as $2 \times f_s$ or $4 \times f_s$. It is pointed out that the intermediate signal $o_m$ still contains the interesting signal components above the final Nyquist frequency of the analog-to-digital converter 2 but also contains some parts of the noise shaped quantization noise as well as signal components below the final Nyquist frequency.

In the following example, the intermediate sampling rate $f_m$ of the intermediate signal $o_m$ is $4 \times f_s$, i.e. the intermediate sampling rate $f_m$ is four times the final sampling rate $f_s$. It is expressly pointed out that the inventive idea is also applicable for intermediate signals $o_m$ having another intermediate sampling rate $f_m$, as for example $2 \times f_s$ or $8 \times f_s$.

Although the above-mentioned examples are all integer multiples of the final sampling rate $f_s$, any real numbered multiples of the final sampling rate $f_s$ are implementable without departing from the concept of the present invention.

As an example and for reasons of simplicity, the final sampling rate $f_s$ is assumed to be equal to 20 kHz, although the inventive idea is also applicable for similar sampling rates.

As the power consumption of the signal processing unit 3 is to be kept as low as possible in order to allow a long life time of the battery contained in the hearing device, a digital variety of a down mixing process is applied as it is well known in radio technology for receivers with radio frequency signals. Thereto, a so-called superhet receiver principle as, for example, applied on single sideband (SSB) modulated signals is used.

In FIG. 3, the analog-to-digital converter 2 is depicted by a dashed line box that converts the analog input signal i into the first output signal $o_1$ having a final sampling rate $f_s$. After the modulator unit 21 by which the input signal i is sampled at an oversampling rate, the internal signal contains significant amounts of quantization noise at high frequencies, which get filtered out in the subsequent filter and decimation stages 22 to 24.

According to the present invention, it is proposed to extracting the so far not used spectral components above the Nyquist frequency, i.e. for example between half the final sampling rate $f_s$ and the final sampling rate $f_s$, from an internal signal of the analog-to-digital converter 2 with a band pass filter unit 31, mixing it or frequency shifting it down to a base band by a mixing unit 32, filtering out other mixing products with a low pass filter unit 33 and reducing the intermediate sampling frequency to the final sampling rate $f_s$ by decimating the sampling rate in a decimation unit 34.

Therewith, the second output signal $o_2$ is obtained comprising information above the Nyquist frequency of the input signal i. In addition, the second output signal $o_2$ is available at the final sampling rate $f_s$, which allows reducing power consumption for the processing of these frequency components in the signal processing unit 3 substantially.

As most of the signal energy of the intermediate signal $o_m$ lies between DC and the Nyquist frequency ($f_s/2$), the band pass filter unit 31 must have a sufficient attenuation up to the Nyquist frequency, which is also designated as lower cut-off frequency $fc_{low}$. At the other end, i.e. at half the intermediate sampling rate $f_m$ or below, this is also designated as upper cut-off frequency $fc_{upper}$. For example, the band pass filter unit 31 is designed such that the attenuation of the band up to the Nyquist frequency ($f_s/2$) is at least 90 dB up to $0.2 \times f_s$ and at least 60 dB up to $0.4 \times f_s$. The attenuation at the higher end towards e.g. $4 \times f_s$ is less critical as less signal energy is present from the input transducer.

For the step of mixing or shifting a frequency range, a mixing frequency can be used in the mixing unit 32 such that other resulting mixing frequencies get aliased back in the decimation unit 34 to the same location in the base band, thus enforcing the signal energy there constructively.

Mathematically, the step of mixing or shifting frequency components can be expressed as follows:

$$F_{mix} = f_{in} \pm f_{LO}$$

Selecting $f_{LO} = f_s/2$ (e.g. =10 kHz) shifts the output of the band pass filter unit 31 into the base band between DC (Direct Current) and half the final sampling rate $f_s$, but also between the final sampling rate $f_s$ and 3/2 times the final sampling rate $f_s$. The low pass filter unit 33 can get used to either attenuate the latter part or decimation folds it back into the base band.

The step of mixing or frequency shifting is a multiplication of the output signal of the band pass filter unit 31 with a local oscillator signal, for example a cosine of $f_s/2$. At $f_m = 4 \times f_s$, the cosine amounts to the repeating sequence

[1 0.707 0 −0.707 −1 −0.707 0 0.707]

As can be seen from the above, the only real multiplications would be the ones of the input signal with 0.707. If the intermediate sampling rate $f_m$ is reduced in the decimation unit 34 by a factor of four, three out of four products will be eliminated resulting in trivial multiplications by 1 or −1, respectively, thereby also keeping the energy in the signal equal.

Thus the step of mixing or frequency shifting in this specific case boils down to a selection of either the intermediate signal $o_m$ or the inverted intermediate signal $o_m$. As a low pass filter is applied on the intermediate signal $o_m$ (being at a sampling rate of four times the final sampling rate $f_s$) afterwards, the effective sequence is:

[1 1 1 1 −1 −1 −1 −1]

The low pass filter unit 33 is not needed in these circumstances though. This embodiment is illustrated in FIG. 4 in that only a band pass filter unit 31 and the decimation unit 34 are shown. Nevertheless, the low pass filter unit 33 is used in a still further embodiment of the present invention as it may further attenuate high frequency noise before down sampling it in the decimation unit 34, as such noise would fold back into the base band.

In a still further embodiment of the present invention, the entire additional circuitry comprising the band pass filter unit 31, the mixing unit 32 and the low pass filter unit 33 are implemented multiplier-free, i.e. with parameters containing only a few significant bits (typical one to two bits, max. three bits), as multiplications with such parameters can be implemented in hardware very cheap with only a few adders. The area and power consumption impact of the entire circuitry is then negligible because additional current can be assumed to be only a dozen μA, the additional number of gates can be expected to be less than 5'000 gates which can be realized on a chip area that is less than 0.013 mm². Of course, these numbers are depending on chip technology node.

However, it is pointed out that a classical implementation with a multiplier can be implemented either in software or in hardware although power consumption is increased.

In a still further embodiment of the present invention, the mixing unit 32 (FIG. 3) uses an I/Q demodulator generating a complex valued output signal. This embodiment can result in a higher processing effort.

Finally, it is pointed out that the present invention can also be used as a frontend for acoustic programming or a remote control.

FIG. 5 again shows a block diagram of the front end of a third embodiment of a hearing device according to the present invention. In contrast to the embodiment depicted in FIG. 4, the embodiment of FIG. 5 comprises only a mixing unit 32 after the band pass filter unit 31. As a result thereof, the intermediate output signal $o_{m2}$ has a higher sampling rate, namely the intermediate sampling rate $f_m$ as the intermediate signal $o_m$. However, the information above half the final sampling rate $f_s$ is nevertheless available and can be processed in the signal processing unit 3 (FIG. 1) although at a higher pace. Therefore, the energy consumption is still somewhat higher than for the embodiment comprising the decimation unit 34 (FIGS. 3 and 4).

What is claimed is:

1. A method for extending a usable frequency range of an analog input signal (i) being processed by a hearing device, the method comprising the steps of:

converting the analog input signal (i) to a first digitized output signal ($o_1$) and to an intermediate signal ($o_m$), the first output signal ($o_1$) having a final sampling rate and the intermediate signal ($o_m$) having an intermediate sampling rate that is greater than the final sampling rate, applying band-pass filtering to the intermediate signal ($o_m$) in order to obtain a filtered intermediate signal ($o_{mf}$), a lower cut-off frequency of the band-pass filtering being above half the final sampling rate, an upper cut-off frequency of the band-pass filtering being below half the intermediate sampling rate, and shifting a spectrum of the filtered intermediate signal ($o_{mf}$) to a frequency range being below the final sampling rate to obtain an intermediate output signal ($o_{m2}$).

2. The method of claim 1, further comprising the step of decimating the intermediate output signal ($o_{m2}$) having the intermediate sampling rate to the final sampling rate to obtain a second output signal ($o_2$).

3. The method of claim 2, further comprising the step of processing the first output signal ($o_1$) and the second output signal ($o_2$) in the hearing device.

4. The method of claim 1, wherein the step of converting the analog input signal (i) is performed by at least two decimation stages (22, 23, 24).

5. The method of claim 1, wherein the spectrum of the filtered intermediate signal ($o_{mf}$) is shifted to a frequency range lying below half the final sampling rate.

6. The method of claim 1, wherein the intermediate sampling rate is an even integer multiple higher than the final sampling rate.

7. The method of claim 6, wherein the intermediate sampling rate is four times higher than the final sampling rate.

8. The method of claim 1, further comprising the step of processing the first output signal ($o_1$) and the intermediate output signal ($o_{m2}$) in the hearing device.

9. A hearing device comprising:
an input transducer (1) for generating an analog input signal (i),
an analog-to-digital converter (2) for converting the analog input signal (i) to a first output signal ($o_1$) and to an intermediate signal ($o_m$), the first output signal ($o_1$) having a final sampling rate and the intermediate signal ($o_m$) having an intermediate sampling rate that is greater than the final sampling rate,
a band-pass filter (31) for processing the intermediate signal ($o_m$) in order to obtain a filtered intermediate signal ($o_{mf}$), a lower cut-off frequency of the band-pass filter (31) being above half the final sampling rate, an upper cut-off frequency of the band-pass filter (31) being below half the intermediate sampling rate, and
means for shifting a spectrum of the filtered intermediate signal ($o_{mf}$) to a frequency range being below the final sampling rate to obtain an intermediate output signal ($o_{m2}$).

10. The hearing device of claim 9, further comprising a decimation unit (34) for decimating the intermediate signal ($o_m$) having the intermediate sampling rate to the final sampling rate to obtain a second output signal ($o_2$).

11. The hearing device of claim 10, further comprising a signal processing unit (3) for processing the first output signal ($o_1$) and the second output signal ($o_2$).

12. The hearing device of claim 9, wherein the analog-to-digital converter (2) comprises at least two decimation stages (22, 23, 24).

13. The hearing device of claim 9, wherein the spectrum of the filtered intermediate signal ($o_{mf}$) is shifted to a frequency range lying below half the final sampling rate.

14. The hearing device of claim 9, wherein the intermediate sampling rate is an even integer multiple higher than the final sampling rate.

15. The hearing device of claim 14, wherein the intermediate sampling rate is four times higher than the final sampling rate.

16. The hearing device of claim 9, further comprising a signal processing unit (3) for processing the first output signal ($o_1$) and the intermediate output signal ($o_{m2}$).

* * * * *